United States Patent
Cho (10) Patent No.: US 7,482,240 B2
(45) Date of Patent: Jan. 27, 2009

(54) METHOD FOR MANUFACTURING SEMICONDUCTOR DEVICE

(75) Inventor: Young Man Cho, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 572 days.

(21) Appl. No.: 11/321,627

(22) Filed: Dec. 30, 2005

(65) Prior Publication Data

US 2007/0045666 A1 Mar. 1, 2007

(30) Foreign Application Priority Data

Jul. 22, 2005 (KR) .................. 10-2005-0066697

(51) Int. Cl.
*H01L 21/82* (2006.01)
*H01L 21/70* (2006.01)
*H01L 27/108* (2006.01)

(52) U.S. Cl. .................. 438/387; 438/396; 438/386
(58) Field of Classification Search .......... 438/386, 438/387, 396
See application file for complete search history.

(56) References Cited

U.S. PATENT DOCUMENTS

| 7,186,593 B2 | 3/2007 | Kim .................. 438/132 |
| 2002/0102807 A1* | 8/2002 | Kim et al. .................. 438/386 |
| 2006/0024902 A1* | 2/2006 | Ajmera et al. .................. 438/387 |

FOREIGN PATENT DOCUMENTS

| KR | 20030056930 A | 7/2003 |
| KR | 1020040095918 A | 11/2004 |

* cited by examiner

*Primary Examiner*—M. Wilczewski
*Assistant Examiner*—Pamela E Perkins
(74) *Attorney, Agent, or Firm*—Townsend and Townsend and Crew LLP (57) ABSTRACT

Disclosed herein is a method for manufacturing a semiconductor device. According to the present invention, an USG (undoped silicate glass) layer is utilized during a process of forming a capacitor to leave a hard mask layer and a polysilicon layer on the top surface of a peripheral circuit region, and then a plate electrode layer on the peripheral circuit region is removed in a subsequent process to prevent a cut fuse pattern from being oxidized, thereby improving device characteristics and reliability of the semiconductor device.

19 Claims, 8 Drawing Sheets

METHOD FOR MANUFACTURING SEMICONDUCTOR DEVICE

BACKGROUND OF THE INVENTION

1. Field of the Invention

The present invention relates to a memory device. In particular, the present invention provides a method for manufacturing a semiconductor device, and more specifically to a method for manufacturing a semiconductor device wherein an USG (undoped silicate glass) layer is utilized during a process of forming a capacitor to leave a hard mask layer and a polysilicon layer on the top surface of a peripheral circuit region, and then a plate electrode layer on the peripheral circuit region is removed in a subsequent process to prevent a cut fuse pattern from being oxidized, thereby improving device characteristics and reliability of the semiconductor device.

2. Discussion of the Related Art

FIGS. 1a through 1d are cross-sectional views illustrating a conventional method for manufacturing a semiconductor device.

Figure 1A:
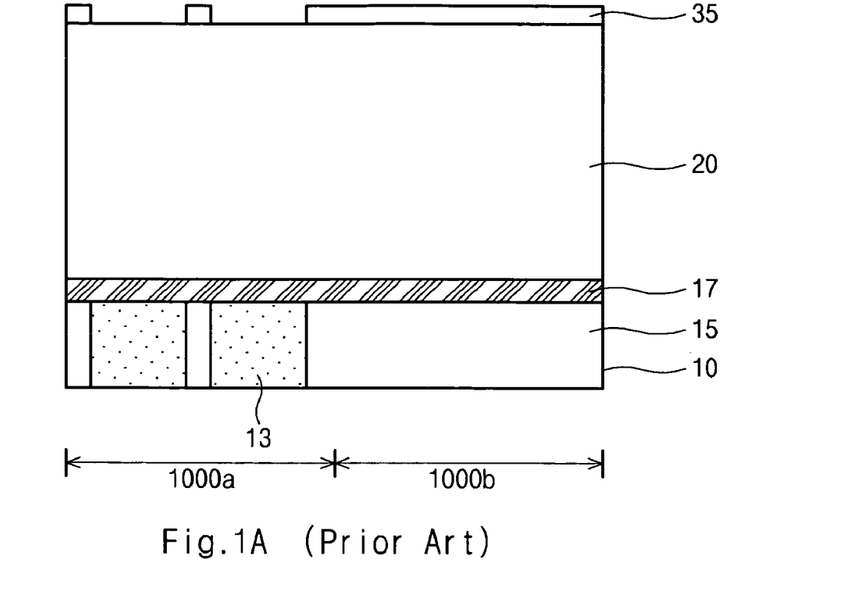
FIGS. 1a through 1d are simplified cross-sectional views illustrating a conventional method for manufacturing a semiconductor device.

Referring to FIG. 1a, a barrier nitride film 17 is formed on the entire surface of a semiconductor substrate 10 having a lower structure such as a storage electrode contact plug 13 and a first interlayer insulating film 15, and then a first oxide film 20 and a nitride film (not shown) are sequentially deposited on the barrier nitride film 17. Next, the nitride film on a cell region 1000a is etched using a capacitor mask as an etching mask to form a nitride film pattern 35 exposing the first oxide film 20 in a capacitor region.

Figure 1B:
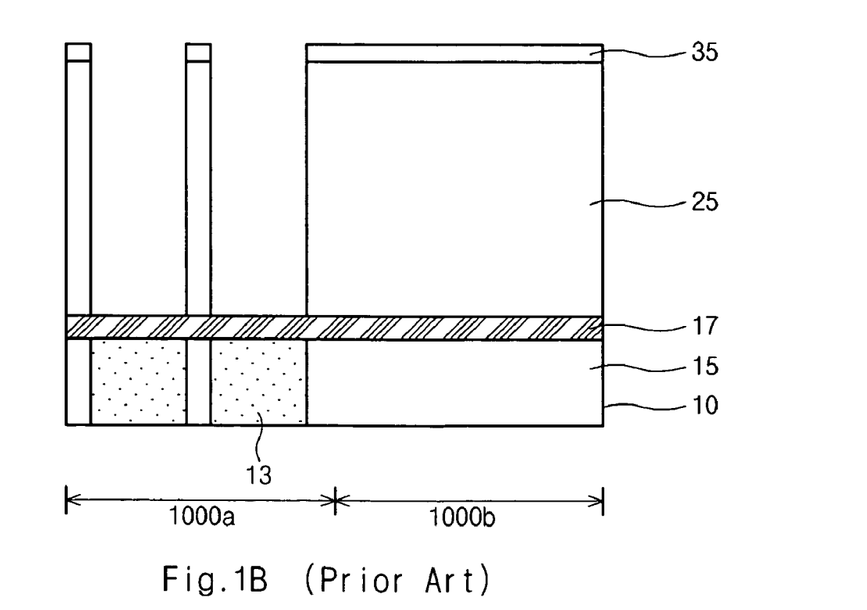

Referring to FIG. 1b, the exposed first oxide film 20 is etched using the nitride film pattern 30 as an etching mask to form a first oxide film pattern 25 defining the capacitor region.

Figure 1C:
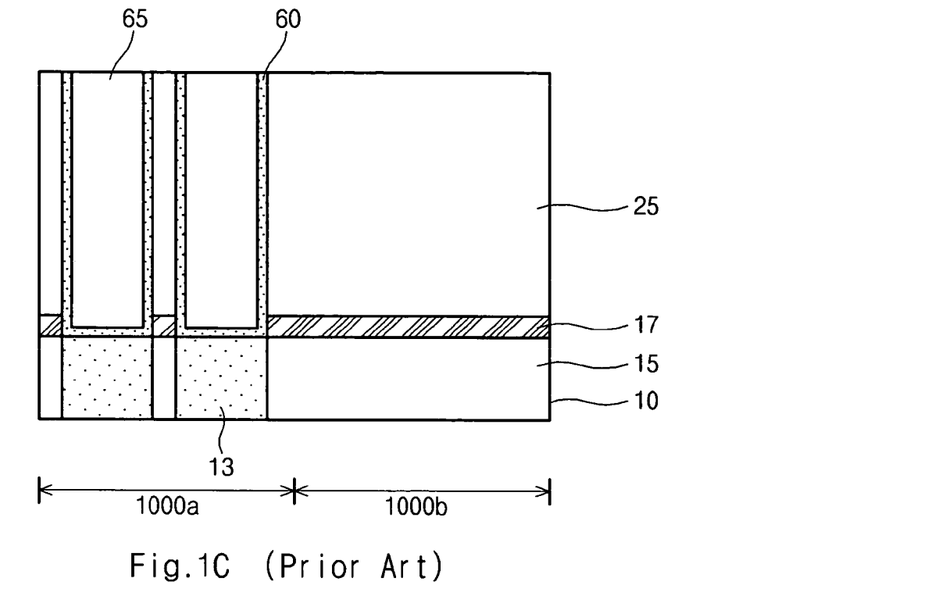

Referring to FIG. 1c, the barrier nitride film 17 exposed in the capacitor region is etched to expose the lower structure, and then a lower electrode layer 60 is formed on the entire surface of the resultant. Next, a second oxide film 65 filling up the capacitor region is formed on the entire surface. A CMP process is performed until the first oxide film pattern 25 is exposed so as to remove the nitride film pattern 35.

Figure 1D:
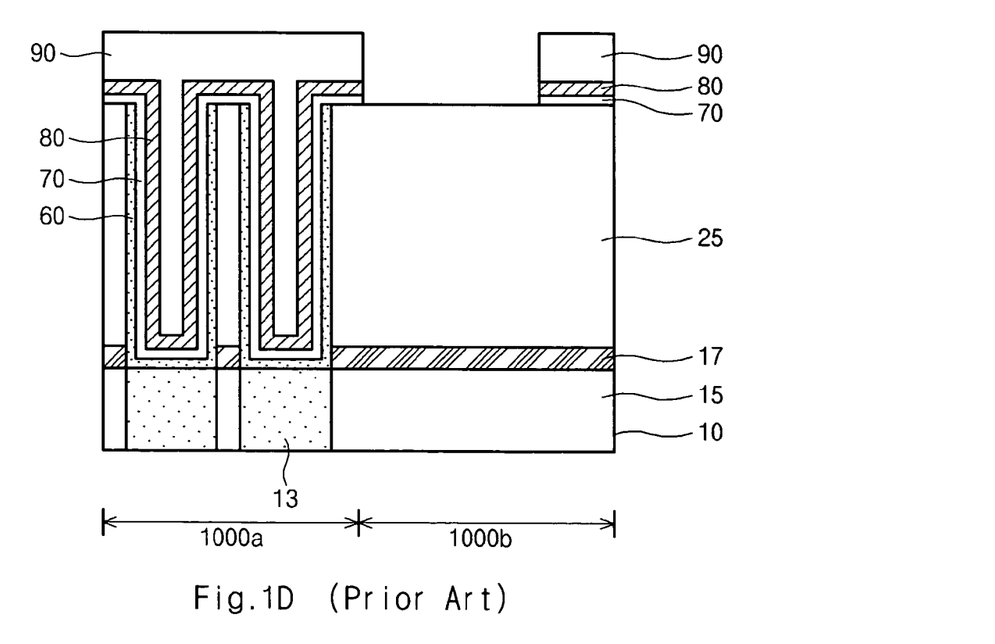

Referring to FIG. 1d, the second oxide film 65 is removed to expose the lower electrode layer 60, and then a dielectric layer 70 and a plate electrode layer 80 are sequentially formed on the entire surface. Next, a planarized polysilicon layer 90 filling up at least the capacitor region is formed on the entire surface of the resultant. Thereafter, the polysilicon layer 90, the plate electrode layer 80 and the dielectric layer 70 on the peripheral circuit region 1000b adjacent to the cell region 1000a are etched by a predetermined width to expose the first oxide film pattern 25 on the peripheral circuit region 1000b.

Figure 2:
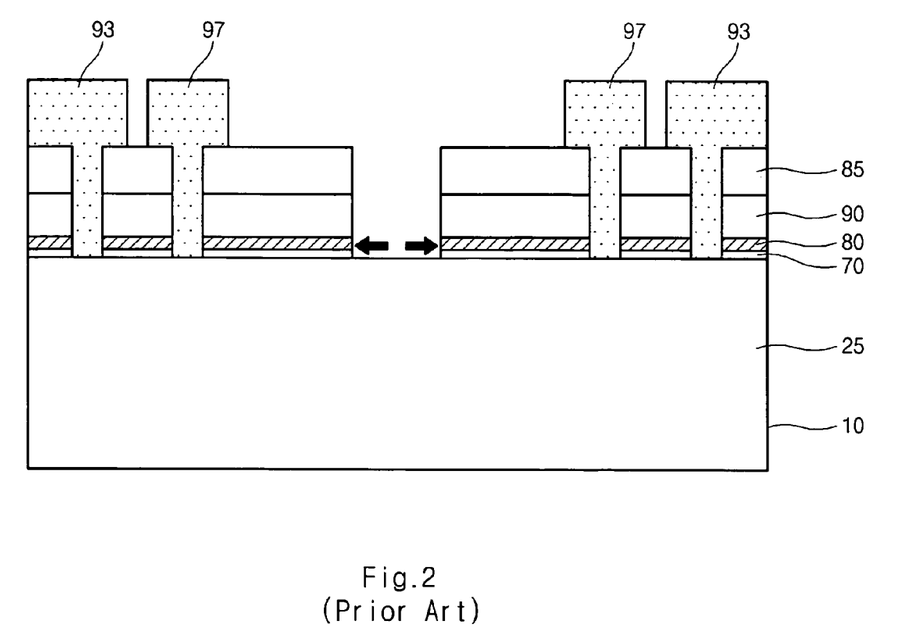
FIG. 2 is a simplified cross-sectional view showing a cut fuse pattern of the semiconductor device according to the conventional method for manufacturing a semiconductor device.

FIG. 2 is a cross-sectional view showing a cut fuse pattern of the semiconductor device according to the conventional method for manufacturing a semiconductor device.

Referring to FIG. 2, a fuse pattern (not shown) is formed on the peripheral circuit region 1000b according to the above conventional method for manufacturing a semiconductor device. A metal line 93 is formed in the fuse pattern serving as a repair fuse. When a circuit with a defect is found during a test process for the semiconductor device, the fuse pattern corresponding the fault circuit is cut using a laser in order to prevent the fault circuit from being worked. However, according to the conventional method for manufacturing a semiconductor device, the fuse pattern includes the plate electrode layer 80 made of a metal material such as TiN, W and Cu. In the case of the cut fuse pattern, the exposed plate electrode layer 80 is oxidized to degenerate the electric characteristic of a semiconductor device even in a normal circuit.

In order to solve such a problem, a metal line 97 for an oxidation stopper is further formed between the metal line 93 and the blown portion of the fuse pattern so as to prevent the oxidation of the plate electrode layer 70 exposed in the blown portion from causing the metal line 93. However, the metal line 97 for an oxidation stopper must have an additional formation process, thus lowering the yield of the semiconductor device.

SUMMARY OF THE INVENTION

According to the present invention, techniques for a memory device are provided. In particular, the present invention provides a method for manufacturing a semiconductor device. More specifically, the present invention provides a method for manufacturing a semiconductor device wherein an USG layer is utilized during a process of forming a capacitor to leave a hard mask layer and a polysilicon layer on the top surface of a peripheral circuit region, and then a plate electrode layer on the peripheral circuit region is removed in a subsequent process to prevent a cut fuse pattern from being oxidized, thereby improving device characteristics and reliability of the semiconductor device.

In order to achieve the above advantage, in an embodiment of the present invention, a method for manufacturing a semiconductor device includes the steps of: (a) sequentially forming a first oxide film, a nitride film, and a stacked structure of a first polysilicon layer pattern and a hard mask layer pattern on a cell region and a peripheral circuit region of a semiconductor substrate having a lower structure, wherein the stacked structure defines a capacitor region, (b) forming an USG layer on the entire surface, wherein the thickness of the USG layer on the peripheral circuit region is thicker than that on the cell region, (c) selectively removing the USG layer on the cell region to expose the nitride film in the capacitor region, (d) removing the hard mask layer pattern on the cell region, and selectively removing the exposed nitride film to expose the first oxide film in the capacitor region, (e) removing the USG layer on the peripheral circuit region, and then selectively removing the exposed first oxide film to expose the lower structure in the capacitor region, (f) removing the first polysilicon layer pattern and the remaining nitride film on the cell region, (g) removing the hard mask layer pattern on the peripheral circuit region, and then forming a lower electrode layer on the surface of the capacitor region, (h) sequentially forming a dielectric layer, a plate electrode layer and a planarized second oxide film on the entire surface of the resultant, wherein the second oxide film fills up the capacitor region, (i) polishing the second oxide film, the plate electrode layer and the dielectric layer to expose the first polysilicon layer pattern on the peripheral circuit region, (j) removing the second oxide film, and then forming a planarized second polysilicon layer filling up the capacitor region on the entire surface of the resultant, and (k) patterning the second polysilicon layer, the first polysilicon layer pattern and the nitride film on the peripheral circuit region adjacent to the cell region using a fuse forming mask to form a fuse pattern.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

FIGS. 3a through 3h are simplified cross-sectional views illustrating a method for manufacturing a semiconductor device in accordance with an embodiment of the present invention.

Figure 3A:
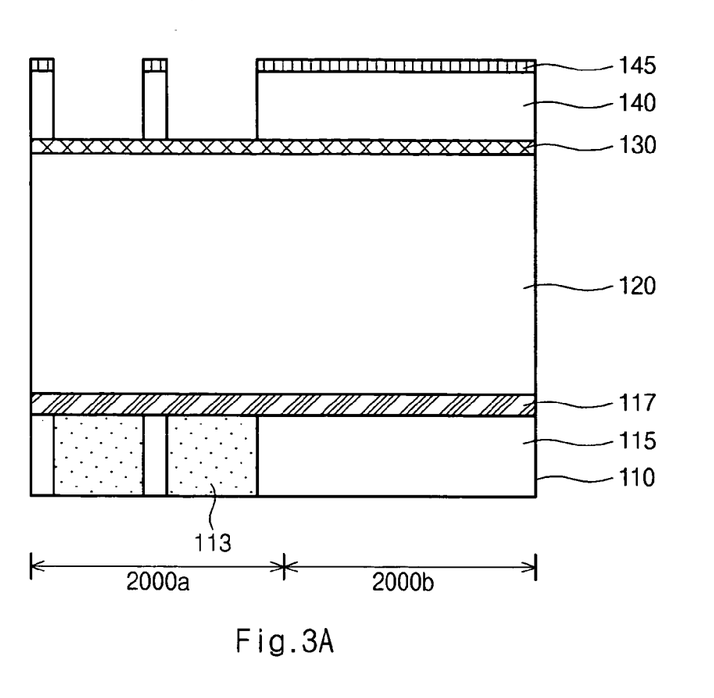
FIGS. 3a through 3h are simplified cross-sectional views illustrating a method for manufacturing a semiconductor device in accordance with an embodiment of the present invention.

Referring to FIG. 3a, a barrier nitride film 117 is formed on a cell region 2000a and a peripheral circuit region 2000b of a semiconductor substrate 110 having a lower structure such as a storage node contact plug 113 and a first interlayer insulating film 115. A first oxide film 120, a nitride film 130 for an etch barrier layer and a staked structure of a first polysilicon layer pattern 140 and a hard mask layer pattern 145 are sequentially formed on the barrier nitride film 117. Here, the stacked structure defines a capacitor region. At this time, the nitride film 117 for an etch barrier layer is preferably selected from the group consisting of PE-nitride, LP-nitride or a combination thereof with its thickness of ranging from 300 Å to 2000 Å. The hard mask layer pattern 145 is preferably selected from the group consisting of Ti, TiN, W or combinations thereof with its thickness of ranging from 300 Å to 2000 Å.

Figure 3B:
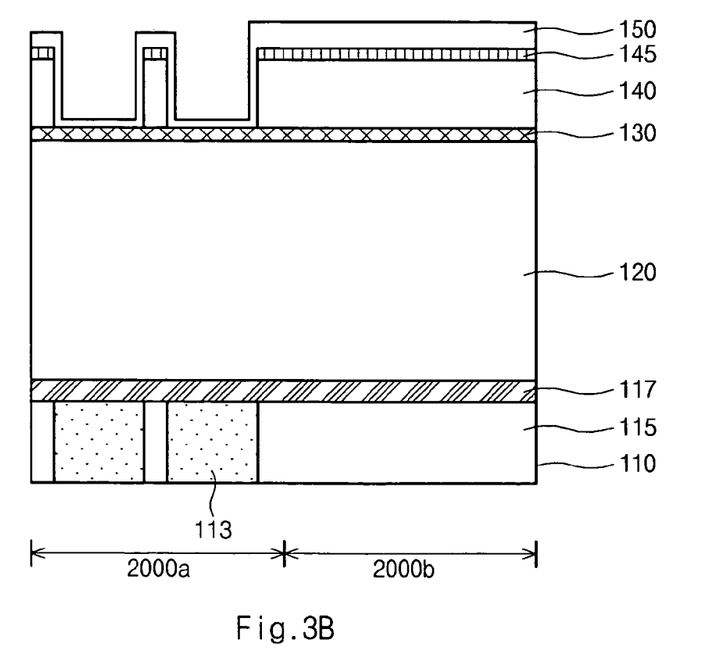

Referring to FIG. 3b, an USG (undoped silicate glass) layer 150 is formed on the entire surface of the resultant. Preferably, a thickness of the USG layer 150 ranges from 500 Å to 2000 Å. Here, the USG layer 150 has a specific characteristic having a different deposition thickness in accordance with a surrounding environment. That is, the USG layer 150 is abnormally deposited on a narrow and vertical surface, so that its thickness is thin while it normally deposited on the wide and plate surface. Thus, the thickness of the USG layer 150 is thin on the cell region 2000a having a large topology while it is thick on the peripheral circuit region 2000b having a relatively small topology.

Figure 3C:
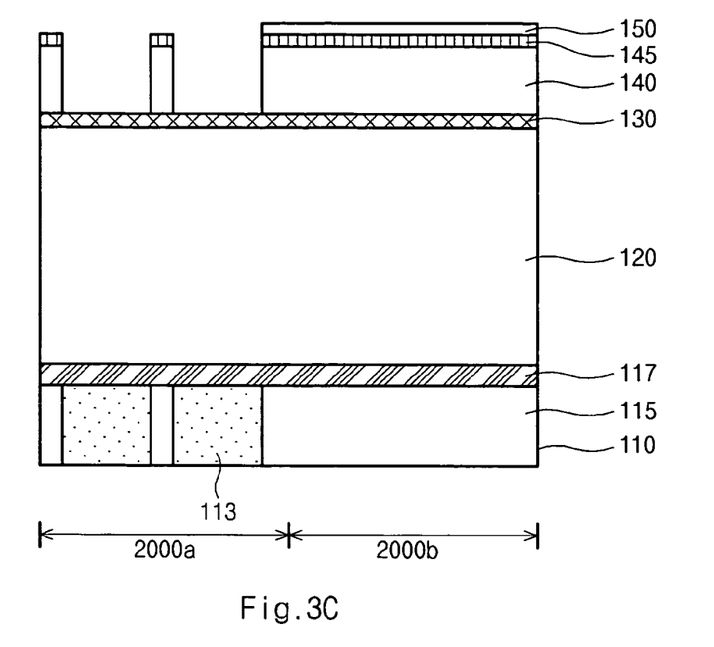

Referring to FIG. 3c, the USG layer 150 on the cell region 2000a is removed to expose the nitride film 130 in the capacitor region. Here, the process of removing the USG layer 150 is preferably performed by a wet etching method or an isotropic dry etching method.

Figure 3D:
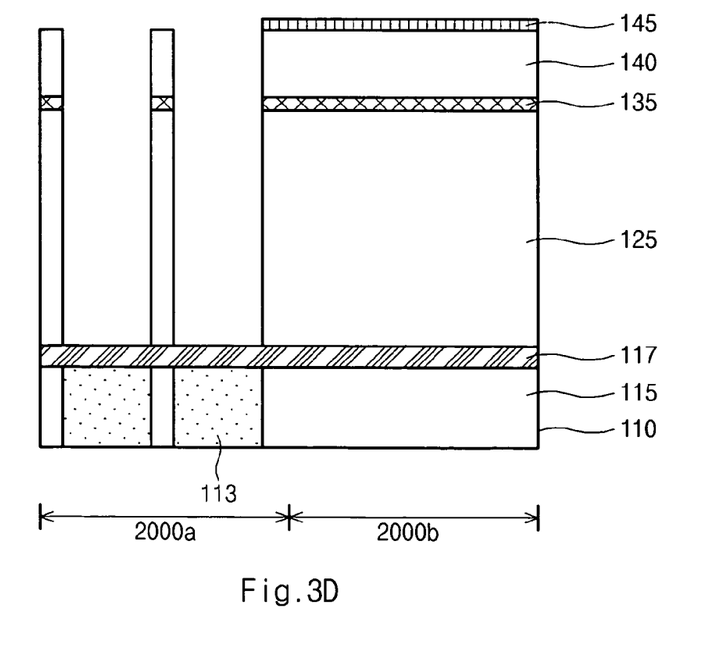

Referring to FIG. 3d, the hard mask layer pattern 145 on the cell region 2000a and the nitride film 130 for an etch barrier layer are removed to form a nitride film pattern 135 exposing the first oxide film 120 in the capacitor region. Here, the process of removing the hard mask layer pattern 145 and the exposed nitride film 130 are preferably performed by a dry etching method using the etch selectivity over the USG layer 150 on the peripheral circuit region 2000b.

Next, the USG layer 150 on the peripheral circuit region 2000b is removed by a wet etching method, and then the first oxide film 120 is etched using the hard mask layer pattern 145 and the first polysilicon layer pattern 135 as an etching mask to form a first oxide film pattern 125 exposing the barrier nitride film 117 in the capacitor region. Here, the process of etching the first oxide film 120 is preferably performed by a wet etching method using the etch selectivity over the hard mask layer pattern 145.

Figure 3E:
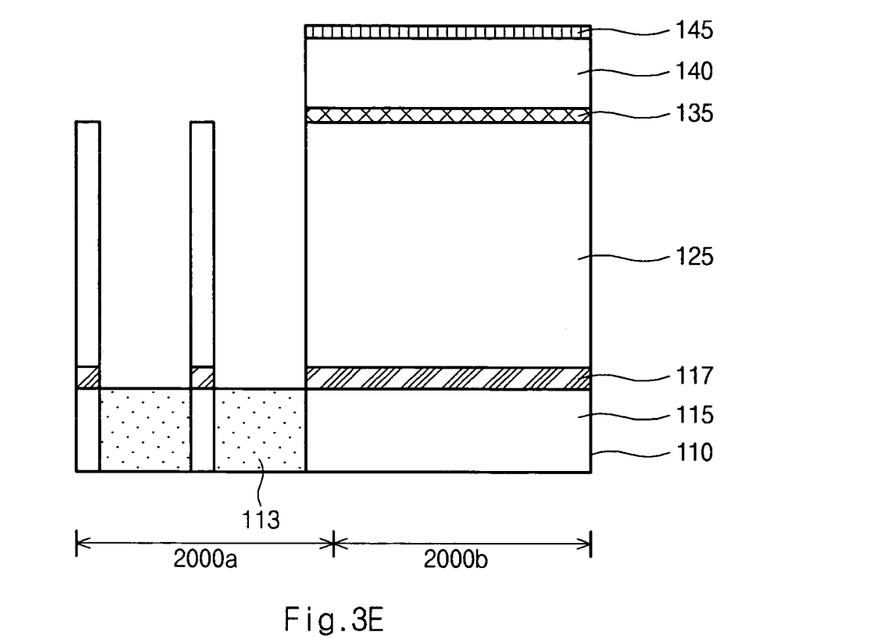

Referring to FIG. 3e, the first polysilicon layer pattern 140 and the nitride film pattern 135 in the cell region 2000a are removed. Here, the process of removing the first polysilicon layer pattern 140 is preferably performed by a wet or dry etching method using the etch selectivity over the hard mask layer pattern 145 on the peripheral circuit region 2000b. The barrier nitride film 117 exposed in the capacitor region is preferably removed to expose the lower structure while the process of removing the nitride film pattern 135 is performed by a wet etching method.

Figure 3F:
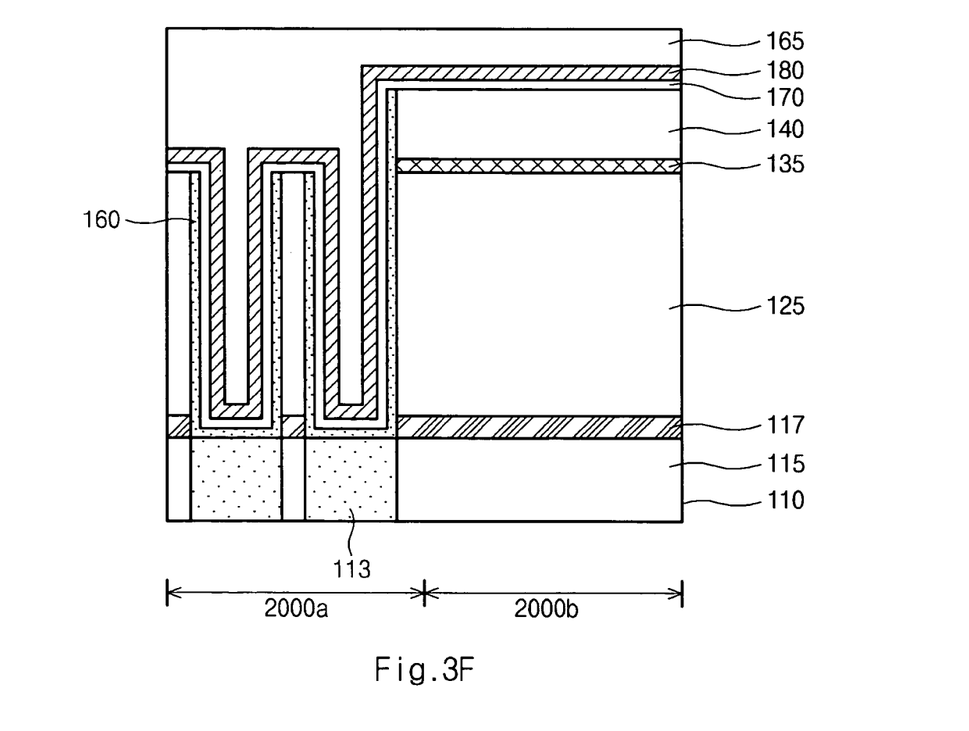

Referring to FIG. 3f, the hard mask layer pattern 145 on the peripheral circuit region 2000b is removed, and then a lower electrode layer 160 is formed on the entire surface of the resultant. A photoresist film (not shown) filling up the capacitor region is coated on the lower electrode layer 160, and then a blanket of the photoresist film is exposed and developed. Next, the lower electrode layer 160 on the peripheral circuit region 2000b is removed, and then the remaining photoresist film is removed. After that, a dielectric layer 170 and a plate electrode layer 180 are sequentially formed on the entire surface of the resultant. Here, the plate electrode layer 180 is selected from the group consisting of TiN, W, Cu or combinations thereof with its thickness of ranging from 100 Å to 1000 Å.

Next, a planarized second oxide film 165 filling up the capacitor region is formed on the entire surface. Preferably, the second oxide film 165 serving as a plate isolation layer is selected from the group consisting of TEOS (tetra ethyl ortho silicate), PSG (phosphorous silicate glass), USG (undoped silicate glass), BPSG (boron phosphorous silicate glass) or combinations thereof with its thickness of ranging from 5000 Å to 20000 Å.

Figure 3G:
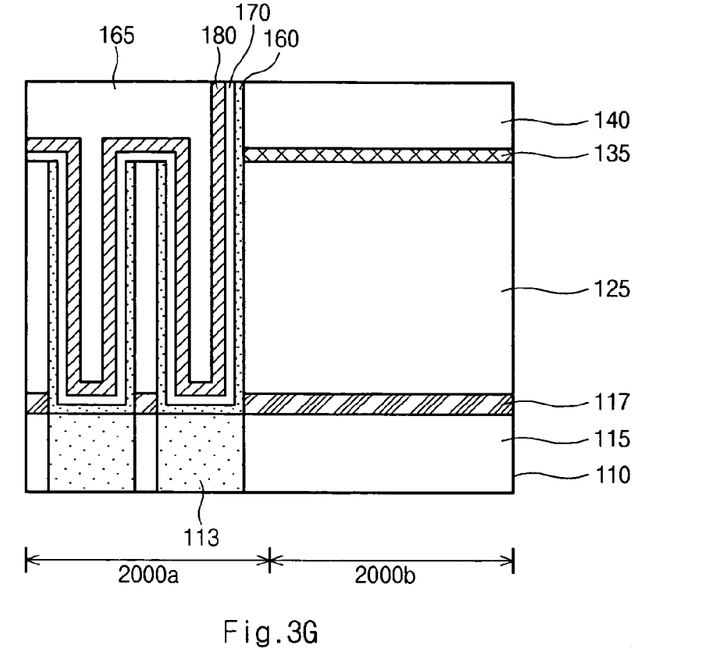

Referring to FIG. 3g, the second oxide film 165, the plate electrode layer 180 and the dielectric layer 170 are polished until the first polysilicon layer pattern 140 is exposed. Preferably, the process of polishing the second oxide film 165, the plate electrode layer 180 and the dielectric layer 170 are performed by a CMP or etch-back method, and the remaining thickness of the second oxide film 165 on the cell region 2000a ranges 500 Å to 2000 Å after the polishing process.

Figure 3H:
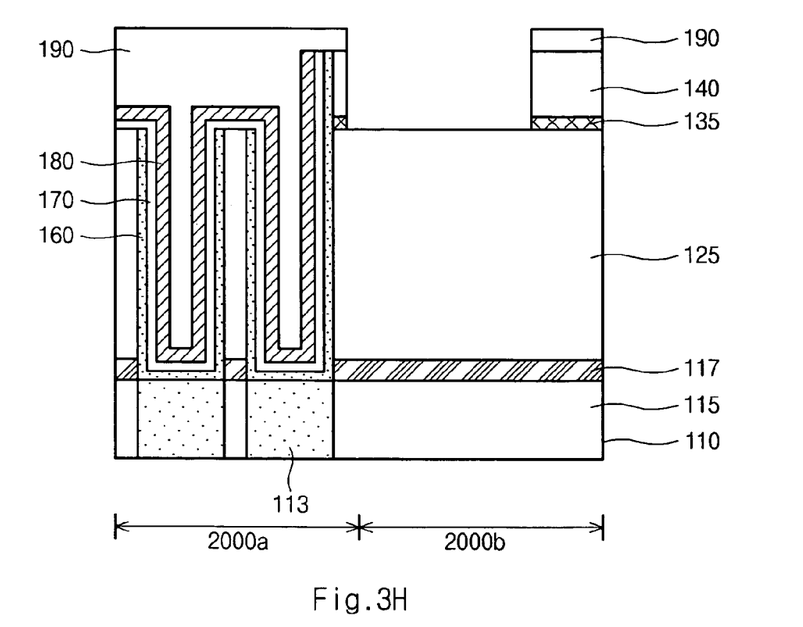

Referring to FIG. 3h, the remaining second oxide film 165 is removed by a wet etching method, and then a planarized second polysilicon layer 190 is formed on the entire surface of the resultant. Next, the second polysilicon layer 190, the first polysilicon layer 140 and the nitride film pattern 135 on the peripheral circuit region 2000b adjacent to the cell region 2000a are removed by a predetermined width until the first oxide film pattern 125 is exposed, so as to form a capacitor (not shown) on the cell region 2000a and a fuse pattern (not shown) on the peripheral circuit region 2000b at the same time. Preferably, the fuse pattern includes a stacked structure of the second polysilicon layer 190, the first polysilicon layer pattern 140 and the nitride film pattern 135 while the capacitor comprises the plate electrode layer 180 made of a metal material. Thus, it is easy to control capacitance of the fuse pattern by adjusting impurity concentration doped on the second polysilicon layer 190 in the fuse pattern.

In a subsequent process, a metal line 193 is formed in the fuse pattern to complete a fuse of the semiconductor device.

Figure 4:
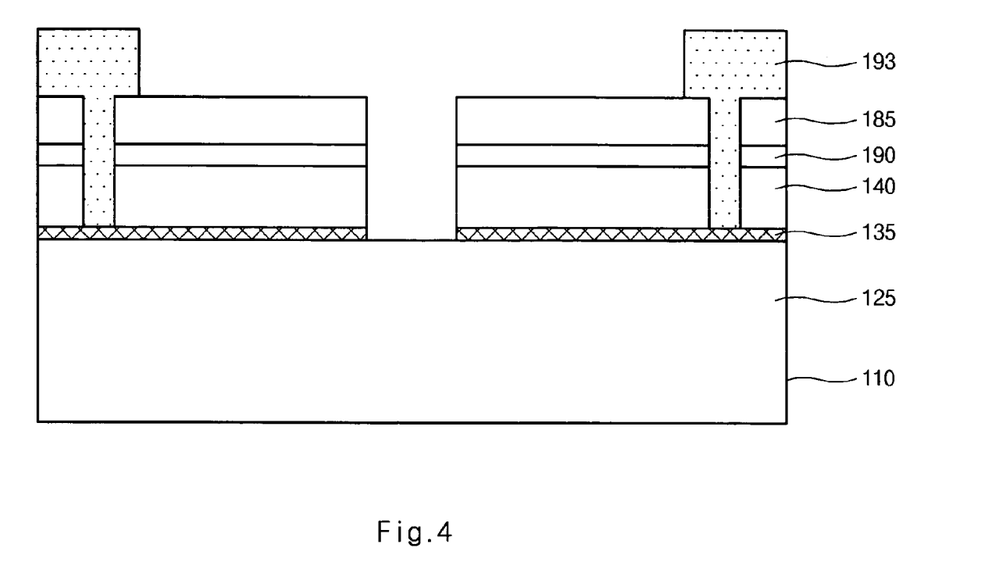
FIG. 4 is a simplified cross-sectional view showing a cut fuse pattern of a semiconductor device in accordance with an embodiment of the present invention.

FIG. 4 is a simplified cross-sectional view showing a cut fuse pattern of a semiconductor device in accordance with an embodiment of the present invention.

Referring to FIG. 4, a predetermined portion of a second interlayer insulating film 185 is formed on the entire surface. Next, the second interlayer insulating film 185, the second polysilicon layer 190 and the first polysilicon layer pattern 140 on the peripheral circuit region 2000*b* are etched to form a metal line contact hole (not shown). Thereafter, a conductive layer (not shown) filling up the metal line contact hole is formed and patterned to form a metal line 193. Here, the fuse pattern can be blown using a laser if a circuit corresponding the fuse pattern fails to work during a test process.

As described above, according to the present invention, in order to form a different stacked structure on the cell region and the peripheral circuit region, the USG layer is formed, and then the oxide film is etched using the USG layer to form a capacitor region, thus a polysilicon layer and a hard mask layer pattern remains on the top surface of the peripheral circuit region. In a subsequent process, a plate electrode layer made of a metal material on the peripheral circuit region is removed to prevent a fuse pattern formed in a subsequent process from being oxidized when the fuse pattern is cut during a test process. Accordingly, the present invention can skip a process of forming a metal line stopping an oxidation of the cut fuse pattern, thus improving the process yield of the semiconductor device. In addition, the present invention can decrease fuse failure, thus improving electric characteristics of the semiconductor device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device comprising the steps of:
   (a) sequentially forming a first oxide film, a nitride film, and a stacked structure of a first polysilicon layer pattern and a hard mask layer pattern on a cell region and a peripheral circuit region of a semiconductor substrate having a lower structure, wherein the stacked structure defines a capacitor region;
   (b) forming an USG (undoped silicate glass) layer on the entire surface, wherein a thickness of the USG layer on the peripheral circuit region is thicker than that on the cell region;
   (c) selectively removing the USG layer on the cell region to expose the nitride film in the capacitor region;
   (d) removing the hard mask layer pattern on the cell region, and selectively removing the exposed nitride film to expose the first oxide film in the capacitor region;
   (e) removing the USG layer on the peripheral circuit region, and then selectively removing the exposed first oxide film to expose the lower structure in the capacitor region;
   (f) removing the first polysilicon layer pattern and the remaining nitride film on the cell region;
   (g) removing the hard mask layer pattern on the peripheral circuit region, and then forming a lower electrode layer on the surface of the capacitor region;
   (h) sequentially forming a dielectric layer, a plate electrode layer and a planarized second oxide film on the entire surface of the resultant, wherein the second oxide film fills up the capacitor region;
   (i) polishing the second oxide film, the plate electrode layer and the dielectric layer to expose the first polysilicon layer pattern on the peripheral circuit region;
   (j) removing the second oxide film, and then forming a planarized second polysilicon layer filling up the capacitor region on an entire surface of a resultant semiconductor substrate; and
   (k) patterning the second polysilicon layer, the first polysilicon layer pattern and the nitride film on the peripheral circuit region adjacent to the cell region using a fuse forming mask to form a fuse pattern.

2. The method according to claim 1, wherein the nitride film serves as an etch barrier layer and is formed of PE-nitride, LP-nitride or a combination thereof.

3. The method according to claim 1, wherein a thickness of the nitride film ranges from about 300 Å to about 2000 Å.

4. The method according to claim 1, wherein the hard mask layer pattern is formed of Ti, TiN, W or combinations thereof.

5. The method according to claim 1, wherein a thickness of the hard mask layer ranges from about 300 Å to about 2000 Å.

6. The method according to claim 1, wherein a thickness of the USG layer ranges from 500 Å to 5000 Å.

7. The method according to claim 1, wherein removing the USG layer is performed by a wet etching method or an isotropic dry etching method.

8. The method according to claim 1, wherein removing the hard mask layer pattern and the nitride film in step (d) is performed by a dry etching method using the etch selectivity over the USG layer on the peripheral circuit region.

9. The method according to claim 1, wherein removing the first oxide film in step (e) is performed by a wet etching method using the etch selectivity over the hard mask layer pattern on the peripheral circuit region.

10. The method according to claim 1, wherein removing the first polysilicon layer pattern on the cell region is performed by a dry or wet etching method using the etch selectivity over the hard mask layer on the peripheral circuit region.

11. The method according to claim 1, wherein removing the nitride film is performed by a wet etching method.

12. The method according to claim 1, wherein the plate electrode layer is formed of TiN, W, Cu or combinations thereof.

13. The method according to claim 1, wherein a thickness of the plate electrode layer ranges from about 100 Å to about 1000 Å.

14. The method according to claim 1, wherein the second oxide film is formed of TEOS (tetra ethyl ortho silicate), PSG (phosphorous silicate glass), USG (undoped silicate glass), BPSG (boron phosphorous silicate glass) or combinations thereof.

15. The method according to claim 1, wherein a thickness of the second oxide film ranges from about 500 Å to about 2000 Å.

16. The method according to claim 1, wherein the process of polishing the second oxide film in step (i) is performed by a CMP or etch-back method.

17. The method according to claim 1, wherein a thickness of the second oxide film after polishing ranges about from 500 Å to about 2000 Å.

18. The method according to claim 1, wherein the process of removing the second oxide film is performed by a wet etching method.

19. The method according to claim 1, further comprising the steps of:

forming an interlayer insulating film on the semiconductor surface including the fuse pattern;

etching a predetermined portion of the interlayer insulating film, the second polysilicon layer and the first polysilicon layer pattern on the peripheral circuit region to form a metal line contact hole; and forming and patterning a conductive layer filling up the metal line contact hole to form a metal line.

* * * * *